(12) United States Patent
Borodulin et al.

(10) Patent No.: US 10,700,270 B2
(45) Date of Patent: Jun. 30, 2020

(54) PCM SWITCH AND METHOD OF MAKING THE SAME

(71) Applicants: Pavel Borodulin, Baltimore, MD (US); Nabil Abdel-Meguid El-Hinnawy, Columbia, MD (US); Robert Miles Young, Ellicott City, MD (US)

(72) Inventors: Pavel Borodulin, Baltimore, MD (US); Nabil Abdel-Meguid El-Hinnawy, Columbia, MD (US); Robert Miles Young, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 437 days.

(21) Appl. No.: 15/188,754

(22) Filed: Jun. 21, 2016

(65) Prior Publication Data

US 2017/0365427 A1     Dec. 21, 2017

(51) Int. Cl.
*H01H 11/00* (2006.01)
*H01L 45/00* (2006.01)
*G11C 13/00* (2006.01)

(52) U.S. Cl.
CPC .......... *H01L 45/06* (2013.01); *H01L 45/1206* (2013.01); *H01L 45/1226* (2013.01);
(Continued)

(58) Field of Classification Search
CPC ..... H01L 45/06; H01L 45/1286; H01L 45/04; H01L 45/16; H01H 11/00; H01H 37/34; Y10T 29/49105
(Continued)

(56) References Cited

U.S. PATENT DOCUMENTS

| 4,539,616 A | 9/1985 | Yuito et al. |
| 4,814,853 A | 3/1989 | Uchida |

(Continued)

FOREIGN PATENT DOCUMENTS

| EP | 1162683 | 12/2001 |
| JP | 2005244831 A | 9/2005 |

(Continued)

OTHER PUBLICATIONS

Hayden, et al.: "Semiconductor Nanowire Devices"; NanoToday, Oct. 31, 2008, vol. 3, No. 5-6, pp. 12-22; found on the internet at: http://www.sciencedirect.com/science/article/pii/S1748013208700616?via%3Dihub.

(Continued)

*Primary Examiner* — Thiem D Phan
(74) *Attorney, Agent, or Firm* — Tarolli, Sundheim, Covell & Tumminio LLP

(57) ABSTRACT

One example includes a method for making a switch. The method includes forming an insulating layer over a substrate. The method also includes forming a resistive heating material over the insulating layer. The method also includes depositing a thermally conductive electrically insulating barrier layer over the heating material. The method also includes forming a phase-change material (PCM) component over the barrier layer spaced apart and proximal to the resistive heating material. The method also includes forming a quench layer proximal to at least one of the resistive heating material and the PCM component. The method further includes forming conductive lines from ends of the PCM component and control lines from ends of the resistive heating material.

8 Claims, 13 Drawing Sheets

(52) U.S. Cl.
CPC ........ *H01L 45/1286* (2013.01); *H01L 45/144* (2013.01); *H01L 45/1666* (2013.01); *G11C 13/0004* (2013.01); *Y10T 29/49105* (2015.01)

(58) Field of Classification Search
USPC .................. 29/622, 592.1, 825, 829, 874
See application file for complete search history.

(56) References Cited

U.S. PATENT DOCUMENTS

| | | | |
|---|---|---|---|
| 5,614,440 | A | 3/1997 | Bezama et al. |
| 5,834,329 | A | 11/1998 | Kim et al. |
| 6,174,175 | B1 | 1/2001 | Behfar et al. |
| 6,248,655 | B1 | 6/2001 | Machida et al. |
| 6,448,576 | B1 | 9/2002 | Davis et al. |
| 6,802,598 | B2 | 10/2004 | Ito et al. |
| 6,828,884 | B2 | 12/2004 | Wyeth et al. |
| 6,953,999 | B2 | 10/2005 | Strandberg et al. |
| 7,094,705 | B2 | 8/2006 | Lin et al. |
| 7,105,377 | B1 | 9/2006 | Chang et al. |
| 7,192,880 | B2 | 3/2007 | Dostalik, Jr. |
| 7,485,968 | B2 | 2/2009 | Enquist et al. |
| 7,608,851 | B2 | 10/2009 | Chen et al. |
| 7,634,248 | B2 | 12/2009 | Xu et al. |
| 7,736,973 | B2 | 6/2010 | Orimoto et al. |
| 7,781,781 | B2 | 8/2010 | Adkisson et al. |
| 7,825,511 | B2 | 11/2010 | Daubenspeck et al. |
| 7,880,194 | B2 | 2/2011 | Breitwisch et al. |
| 7,893,435 | B2 | 2/2011 | Kazlas et al. |
| 8,084,319 | B2 | 12/2011 | Peng et al. |
| 8,242,024 | B2 | 8/2012 | Chen |
| 9,196,585 | B2 | 11/2015 | Katakura |
| 9,257,647 | B2 * | 2/2016 | Borodulin ............. H01L 45/126 |
| 9,419,213 | B2 * | 8/2016 | Raieszadeh ............. H01L 45/06 |
| 2002/0175741 | A1 | 11/2002 | Sher |
| 2003/0219987 | A1 | 11/2003 | Wang et al. |
| 2005/0145832 | A1 | 7/2005 | Meloni et al. |
| 2006/0148233 | A1 | 7/2006 | Datta et al. |
| 2006/0175686 | A1 | 8/2006 | Murata et al. |
| 2007/0096071 | A1 | 5/2007 | Kordus, II et al. |
| 2007/0235708 | A1 | 10/2007 | Elmegreen et al. |
| 2007/0235784 | A1 | 10/2007 | Krusin-Elbaum et al. |
| 2008/0029753 | A1 | 2/2008 | Xu et al. |
| 2008/0083611 | A1 | 4/2008 | Felmetsger |
| 2008/0285335 | A1 | 11/2008 | Elmegreen et al. |
| 2008/0314618 | A1 | 12/2008 | Shimoosako et al. |
| 2009/0152655 | A1 | 6/2009 | Laming et al. |
| 2009/0230379 | A1 | 9/2009 | Klostermann et al. |
| 2009/0242250 | A1 | 10/2009 | Kohda et al. |
| 2009/0291546 | A1 | 11/2009 | Chen et al. |
| 2010/0159645 | A1 | 6/2010 | Yanagida |
| 2010/0187694 | A1 | 7/2010 | Yu et al. |
| 2010/0188892 | A1 | 7/2010 | Baks |
| 2010/0327247 | A1 | 12/2010 | Ward et al. |
| 2011/0012239 | A1 | 1/2011 | Gu et al. |
| 2011/0133284 | A1 | 6/2011 | Mitra et al. |
| 2011/0233766 | A1 | 9/2011 | Lin et al. |
| 2012/0060915 | A1 | 3/2012 | Chan |
| 2012/0293420 | A1 | 11/2012 | Stoumbos et al. |
| 2013/0187120 | A1 | 7/2013 | Redaelli et al. |
| 2014/0266300 | A1 | 9/2014 | Sherwin et al. |
| 2014/0353571 | A1 | 12/2014 | Liu |

FOREIGN PATENT DOCUMENTS

| | | |
|---|---|---|
| JP | 2006173555 A | 6/2006 |
| WO | 2007030483 A2 | 3/2007 |
| WO | 2009001262 A1 | 12/2008 |

OTHER PUBLICATIONS

Fahad, et al.: "Are Nanotube Architectures More Advantageous than Nanowire Architectures for Field Effect Transistors?"; Scientific Reports, Jun. 27, 2012, vol. 2, No. 475, pp. 1-7; found on the internet at: https://www.nature.com/articles/srep00475.

El-Hinnawy, et al.: "Low-loss Latching Microwave Switch Using Thermally Pulsed Non-volatile Chalcogenide Phase Change Materials"; Appl. Phys. Lett. 105, 013501 (2014) doi: 10.1063/1.4885388; Can be found on the internet at: http://aip.scitation.org/doi/10.1063/1.4885388.

Shim, Y. et al., "RF Switches Using Phase Change Materials." MEMS 2013. Figure 1.

Wen, et al., "A Phase-Change Via-Reconfigurable On-Chip Inductor", IEEE 2010, IEDM10-237 thru IEDM10-240.

Bolton:"Mobile Device RF Front-End TAM Analysis and Forecast", CS MANTECH Conference, May 16-19, 2011, Palm Springs, CS, USA, pp. 1-4.

Wang, et al,. "Directly heated four-terminal phase change switches", 2014 IEEE MTT-S International microwave Symposium (IMS2014), Tampa, FL, 2014, pp. 1-4.

N.El-Hinnawy, et al. "Substrate Agnostic Monolithic Integration of the Inline Phase-Change Switch Technology" 2016.

* cited by examiner

PCM SWITCH AND METHOD OF MAKING THE SAME

This invention was made with Government support under Contract No. HR0011-12-C-0095. The Government has certain rights in this invention.

TECHNICAL FIELD

The present disclosure relates to electronics, and more particularly to a PCM switch and method of making the same.

BACKGROUND

Switching devices are implemented for a variety of reasons and in a variety of applications. For example, switching devices can be implemented for logic circuit and computing applications, for radio-frequency (RF) signal switching in RF receivers, transmitters, and/or transmit/receive modules of a communication system, radar, electronic warfare (EW) system, or a variety of other applications. Transistor technology has advanced considerably with respect to reduction of size and increase in efficiency. However, transistor switching devices exhibit signal losses from switching and interconnects. Furthermore, transistor switching devices still occupy a sizeable space on an integrated circuit (IC) or printed circuit board (PCB), and can still consume significant power in maintaining activation of the switches for a given switching state. Other switching devices can be implemented utilizing micro-electromechanical systems (MEMS) processing. However, MEMS processing can be expensive and difficult, can require specialized packaging constraints, and can still exhibit switching losses and activation power consumption.

SUMMARY

One example includes a method for making a switch. The method includes forming an insulating layer over a substrate. The method also includes forming a resistive heating material over the insulating layer. The method also includes depositing a thermally conductive electrically insulating barrier layer over the heating material. The method also includes forming a phase-change material (PCM) component over the barrier layer spaced apart and proximal to the resistive heating material. The method also includes forming a quench layer proximal to at least one of the resistive heating material and the PCM component. The method further includes forming conductive lines from ends of the PCM component and control lines from ends of the resistive heating material.

Another example embodiment includes a PCM switch. The switch includes resistive heating material and a PCM component proximal to the resistive heating material. The switch also includes a thermally conductive electrically insulating barrier layer positioned between the PCM component and the resistive heating material. The switch also includes a quench layer in contact with at least one of the resistive heating material and the PCM component. The quench layer is configured to dissipate heat associated with at least one of the resistive heating material and the PCM component. The switch further includes conductive lines extending from ends of the PCM component and control lines extending from ends of the resistive heating material.

Another example embodiment includes a method for making a switch. The method includes forming an insulating layer over a substrate. The method also includes forming a resistive heating material over the insulating layer. The method also includes depositing a thermally conductive electrically insulating barrier layer over the heating material. The method also includes forming a PCM component over the barrier layer spaced apart and proximal to the resistive heating material. The method also includes forming conductive lines from ends of the PCM component and control lines from ends of the resistive heating material. The method further includes forming a quench layer over the resistive heating material and the PCM component.

DETAILED DESCRIPTION

Figure 1:
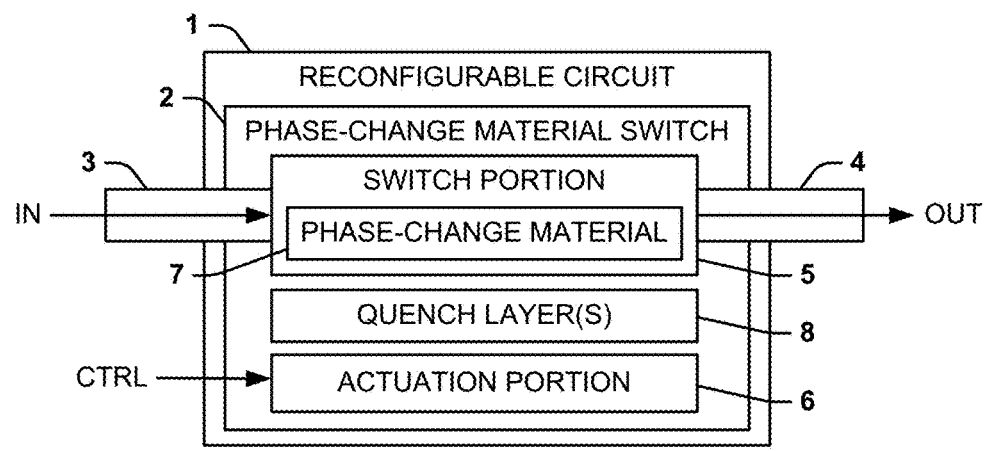
FIG. 1 illustrates an example of a reconfigurable circuit.

The present disclosure provides for a phase-change material (PCM) switch and a method of making the same. The PCM switch is a wideband, low loss, high isolation solid-state electrical switching device disposed monolithically on any wafer substrate material by embedding a variable-resistance thin-film material (e.g., a strip or patch) of PCM within the gap of a conducting metal trace (e.g. a gap in the signal trace of a microstrip or coplanar transmission line), and placing an electrically isolated resistive heating material proximal to the PCM to change its conductivity state. The switch can include two switch terminals, which contact a PCM material on two opposing sides and two control terminals, which make contact to the resistive heating material. The conductivity of the PCM can be changed by temperature cycling the material in a particular way, for example via ohmic (i.e., $I^2R$) heat. For example, heating the material to melting temperature (e.g., approximately 725° C. for the case when the PCM is germanium telluride (GeTe)) and cooling rapidly based on one or more quench layers, as described in greater detail herein, results in an amorphous or insulating state, while heating the material to crystalization temperature (e.g., approximately 180° C. for GeTe), holding at that temperature for a length of time sufficent to induce recrystallization and cooling at any rate results in the crystalline or conductive state.

The resistive heating material (e.g., thin-film resistor) is monolithically integrated with the PCM component to supply the required heating profile for phase transformation. Applying a high power pulse to the resistive heating material for some time (e.g. 1 ns-100 ms) causes the PCM component to take on the amorphous phase, thereby achieving the "off" state. Applying a second power pulse to the resistive heating material induces the recrystallization process which culminates in the crystallization of the PCM, thereby achieving the low resistivity "on" state. In the transformation from crystalline to amorphous, rapid cooling is achieved by keeping the heating pulse short in duration, which allows sufficient time for enough heat to transfer from the resistive heating material to the PCM component to raise its temperature above the melting temperature, but minimizes the amount of heat transferred to the surrounding materials (e.g. quench layer(s)), and thus allows for these materials to stay relatively cool with respect to the PCM component. Heat from the melted PCM component escapes quickly into the relatively cool surrounding materials (e.g. quench layer(s)), allowing for rapid cooling, which limits the mobility of atoms within the PCM and facilitates the solidification of the PCM component into an amorphous state. The switch retains both states (crystalline and amorphous) in the absense of any current or voltage to the heater, making it non-volatile.

As described herein, the PCM switch includes one or more quench layers that are arranged proximal to (e.g., in contact with) at least one of the PCM and/or the actuation portion. The quench layer(s) can be formed from a variety of thermally conductive materials, such as Aluminum Nitride (AlN), Silicon Carbide (SiC), Silicon (Si) or diamond to provide rapid cooling of the PCM component and/or the resistive heating material to allow the PCM component to change state between the conductive (i.e., "on") state and the blocking state (i.e., "off"). As an example, the quench layer(s) can include a single quench layer that is arranged in contact with and beneath the resistive heating material, such as between an insulating layer and the resistive heating material. As another example, the single quench layer can be formed over the PCM switch. As yet another example, the quench layer(s) can include a first quench layer that is arranged in contact with and beneath the resistive heating material and a second quench layer that is formed over the PCM switch. The quench layer may be formed over the PCM component, may be in direct contact with the PCM component, or may be separated by a thin dielectric material. If separated by a thin dielectric material, the quench layer may be electrically conductive (e.g., metallic), such as based on the overlap between the quench layer and the other metallic portions of the switch being minimized in order to limit additional parasitic capacitance that can be introduced by the metallic quench layer. A similar arrangement can be provided for the underlying quench layer.

FIG. 1 illustrates an example of an example of a reconfigurable circuit 1. The reconfigurable circuit 1 includes a phase-change material (PCM) switch 2. The reconfigurable circuit 1 can be implemented in any of a variety of applications that require one or more switches that can be opened or closed to pass or block a signal. For example, the reconfigurable circuit 1 can be implemented in logic circuit and computing applications, radio-frequency (RF) signal switching in RF receivers, transmitters and/or T/R modules of communication, radar and/or EW systems, or in a broadly applicable general purpose RF reconfigurable circuit, such as a RF field-programmable gate array (RF-FPGA). As an example, the reconfigurable circuit 1 can operate in a similar manner, as described in Attorney Docket No. NG(ES)-022068, titled Phase-Change Material Reconfigurable Circuits, which is incorporated herein by reference in its entirety. As described herein, the reconfigurable circuit 1 can implement one or more quench layers that can provide sufficient cooling of the PCM switch 2 to allow proper and sufficiently rapid operation of the PCM switch 2.

In the example of FIG. 1, the PCM switch 2 includes an input 3 that receives an input signal IN, and includes an output 4 that can provide the input signal IN as an output signal OUT in a conducting state of the PCM switch 2, such that the PCM switch 2 acts substantially as a short-circuit, or can block the input signal IN from being provided as the output signal OUT in a blocking state of the PCM switch 2, such that the PCM switch 2 acts substantially as an open-circuit. As an example, the input signal IN can be provided as a radio frequency (RF) signal.

The PCM switch 2 includes a switch portion 5 and an actuation portion 6. The switch portion 5 includes a PCM component 7 that can allow the switch portion 5, and thus the PCM switch 2, to be set to the conducting state or the blocking state. As described herein, a PCM (e.g., the PCM component 7) is any material that exhibits variable electrical resistivity that is dependent on crystallinity. As an example, the PCM component 7 can be a chalcogenide material, such as germanium telluride (GeTe), germanium antimony telluride (GeSbTe), germanium selenium telluride (GeSeTe), or any of a variety of similar materials. The PCM component 7 can thus be set to a crystalline state to set the switch portion 5, and thus the PCM switch 2, to the conducting state, or can be set to an amorphous state to set the switch portion 5, and thus the PCM switch 2, to the blocking state.

The actuation portion 6 can be configured to receive a control signal CTRL to switch the PCM component 7 between the crystalline state and the amorphous state. The actuation portion 6 is configured as a resistive heater that can include, for example, a metal or metal alloy material that exhibits resistivity and a substantially high thermal conductivity. For example, the actuation portion 6 can be formed from niobium (Nb), tungsten (W), platinum (Pt), nickel chromium (NiCr), titanium tungsten (TiW), or any of a variety of similar metal or metal alloys. The actuation portion 6 can be arranged substantially proximal to the PCM component 7 in the switch portion 5, such that heat that is generated in the actuation portion 6 can be thermally conducted to the PCM component 7 in the switch portion 5.

As an example, the actuation portion 6 can be fabricated above the switch portion 5, below the switch portion 5, and/or laterally with respect to the switch portion 5. As another example, the actuation portion 6 could also include a plurality of portions of the metal or metal alloy material that can be distinct or integral with each other and are arranged adjacent to and/or surrounding the switch portion 5 and that are provided the control signal CTRL substantially concurrently. As yet another example, the actuation portion 6 and the switch portion 5 can be separated by a dielectric material (not shown) to substantially prevent electrical connectivity between the actuation portion 6 and the switch portion 5. In addition, the type of dielectric material and the thickness therein can be selected to allow the thermal conductivity from the actuation portion 6 to the switch portion 5, and to allow heat dissipation from the switch portion 5 to an associated substrate via an insulating layer (not shown), as described in greater detail herein.

The control signal CTRL can be provided as, for example, a current pulse in one of two states to generate a heat profile in the actuation portion 6 via ohmic (i.e., $I^2R$) heat. As another example, the control signal CTRL can be another type of pulsed signal, such as an optical pulse having sufficient optical energy to heat the actuation portion 6 and/or the switch portion 5 directly. Thus, based on the proximal arrangement of the actuation portion 6 with respect to the switch portion 5, the heat profile can be thermally transferred to the PCM component 7 in the switch portion 5 to control the state of the switch portion 5. As an example, the control signal CTRL can have pulse characteristics (e.g., amplitude and duration) that can dictate the heat profile. For example, the control signal CTRL can be provided in a first state (e.g., with first pulse characteristics) that can generate a first heat profile in the actuation portion 6, and can be provided in a second state (e.g., with second pulse characteristics) that can generate a second heat profile in the actuation portion 6. The first heat profile can correspond to setting the PCM component 7 to the crystalline state, and thus setting the switch portion 5 to the conducting state, and the second heat profile can correspond to setting the PCM component 7 to the amorphous state, and thus setting the switch portion 5 to the blocking state. Setting the switch portion 5 to the blocking state may require rapid cooling of the PCM component 7, which can nominally depend on characteristics of an insulating layer.

As an example, the reconfigurable circuit 1 can be fabricated such that the PCM switch 2 is arranged above the insulating layer, such as based on requirements associated with other circuitry that is fabricated on the associated wafer.

The thickness of the insulating layer may be required to have a certain minimum thickness, or may have a thickness that is uncertain or difficult to control. However, the thickness of the insulating layer can affect the quench rate associated with the PCM switch 2, such that too great a thickness of the insulating layer (e.g., greater than one hundred nanometers) may result in an insufficiently rapid quench time to allow the PCM switch 2 to properly or quickly enough transition between states (e.g., from the conducting state to the blocking state). As described herein, the term "quench time" describes an amount of time for the PCM component 7 to cool from an elevated temperature, such as from a melting-point temperature to a substantially cool temperature (e.g. the re-crystallization temperature) to provide the PCM component 7 in an amorphous state.

As a result, to provide a sufficiently small quench time to allow proper and/or rapid operation of the PCM switch 2, the PCM switch 2 includes one or more quench layers 8 configured to decrease the quench time for proper or improved operation of the PCM switch 2. The quench layer(s) 8 can be arranged proximal to (e.g., in contact with) at least one of the PCM component 7 and/or the actuation portion 6. The quench layer(s) 8 can be formed from a variety of thermally conductive materials, such as Aluminum Nitride (AlN), Silicon Carbide (SiC), Silicon (Si) or diamond to provide rapid cooling of the PCM component 7 and/or the actuation portion 6, and thus to facilitate the PCM component 7 changing state between the conducting state and the blocking state via the control signal CTRL being provided through the actuation portion 6.

As an example, the quench layer(s) 8 can include a single quench layer 8 that is arranged in contact with and beneath the actuation portion 6. For example, the single quench layer 8 can be formed between the insulating layer and the actuation portion 6. In this example, a second insulating layer can overlie the single quench layer 8, such that the second insulating layer can be formed in contact with at least one peripheral surface of the actuation portion 6. As another example, the single quench layer 8 can be formed over the switch portion 5 of the PCM switch 2, such that the single quench layer 8 can be formed over the PCM component 7, the input 3, and the output 4. As yet another example, the quench layer(s) 8 can include a first quench layer 8 that is arranged in contact with and beneath the actuation portion 6 and a second quench layer 8 that is formed over the switch portion 5 of the PCM switch 2, as described previously, respectively.

Figure 2:
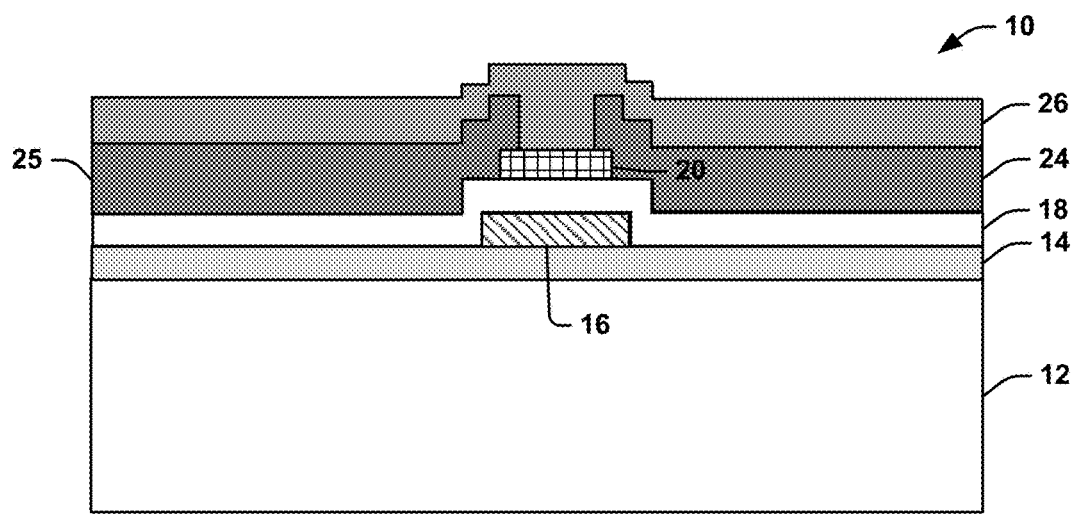
FIG. 2 illustrates an example of a schematic cross-sectional illustration of an example of a phase-change material (PCM) switch structure.
Figure 3:
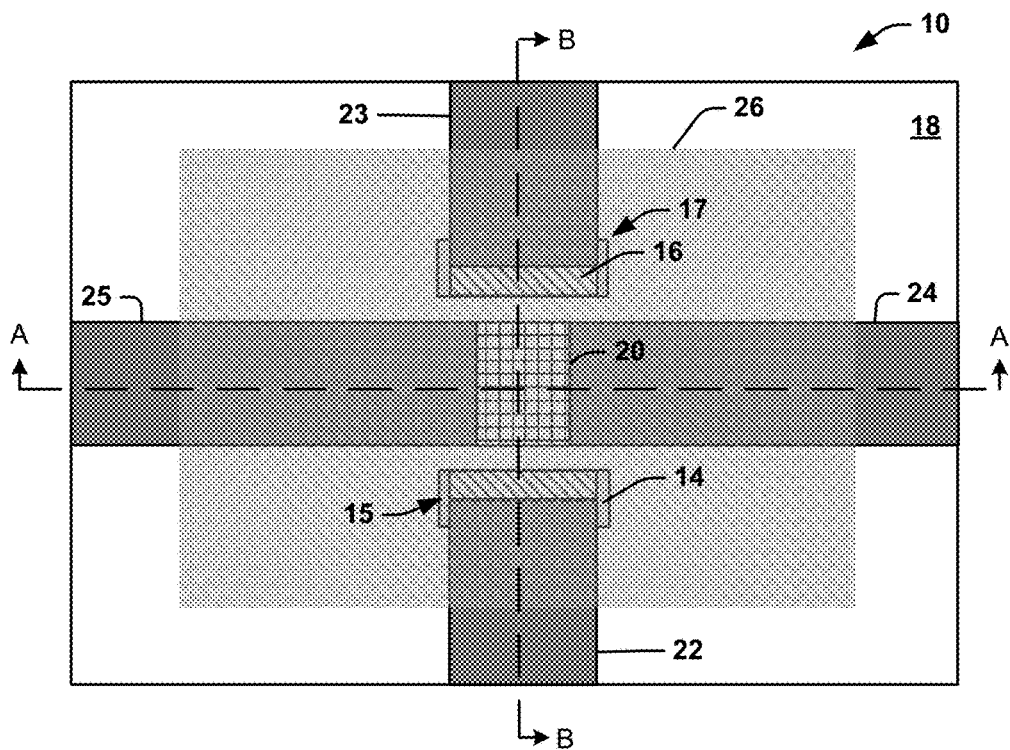
FIG. 3 illustrates an example of a plan view of the PCM switch structure of FIG. 2.

FIG. 2 is a schematic cross-sectional illustration of a PCM switch structure 10 along lines A-A of a plan view of the PCM switch structure 10, as illustrated in FIG. 3. The PCM switch structure 10 includes an insulating layer 14 overlying a substrate 12. The substrate 12 can be formed of a variety of mechanically supportive, insulating, semiconducting and/or conducting materials, such as, but not limited to, Silicon Carbide (SiC), Silicon (Si), Gallium Arsenide (GaAs), Sapphire ($Al_2O_3$), Alumina, Aluminum Nitride (AlN), Quartz ($SiO_2$), Germanium (Ge), Gallium Nitride (GaN), Indium Phosphide (InP), Silicon-on-Insulator (SOI), Silicon-on-Sapphire (SOS), and Silicon Germanium (SiGe). The PCM switch structure 10 could also be added directly to another device wafer (e.g. CMOS, SiGe, BiCMOS, RF-CMOS) with preexisting circuits, including MMICs, ASICs, or RFICs. The insulating layer 14 electrically isolates a resistive heating element 16, corresponding to at least a portion of the actuation portion 6 of the phase-change material switch 2 in the example of FIG. 1, from the substrate 12 and also determines the thermal resistance from the resistive heating element 16 to the substrate 12. The insulating layer 14 can be formed of Silicon Dioxide (SiO$_2$), Aluminum Nitride (AlN), Aluminum Oxide (Al$_2$O$_3$), Silicon Nitride (SiN) or a variety of other electrically insulating materials.

The resistive heating material 16 overlies the insulating layer 14 and a barrier layer 18 overlies the resistive heating material 16. A PCM component 20 overlies the barrier layer 18 and is positioned above the resistive heating material 16, such that heat from the resistive heating material 16 can pass through the barrier layer 18 to the PCM component 20. As shown in the plan view of FIG. 3, the barrier layer 18 includes a first opening 15 from which a first control line 22 is coupled to a first end of the resistive heating material 16 and a second opening 17 in which a second control line 23 is connected to a second end of the resistive heating material 16.

The resistive heating material 16 can include, for example, a metal or metal alloy material that exhibits resistivity and a substantially high thermal conductivity. For example, the resistive heating material 16 can be formed from nickel chromium silicon (NiCrSi), nickel chromium (NiCr), Tungsten (W), Titanium-Tungsten (TiW), Platinum (Pt), Tantalum (Ta), Molybdenum (Mo), Niobium (Nb), or Iridium (Ir), or any of a variety of or a combination of similar metal or metal alloys that have the above properties and have a melting temperature that is higher than the melting temperature of the PCM element 20.

The barrier layer 18 is an electrical insulator that is thermally conductive such that the barrier layer 18 electrically insulates the resistive heating material 16 from the PCM component 20, but allows heat from the resistive heating material 16 to pass through the barrier layer 18 to the PCM component 20 to change the state of the PCM component 20 between a crystallized state in response to a first heat profile and an amorphous state in response to a second heat profile. The barrier layer 18 can be formed of SiN, AlN, SiO$_2$, Silicon Carbide (SiC), diamond (C) or other barrier material having the properties discussed above.

The PCM component 20 can be formed from a variety of PCMs that exhibit variable electrical resistivity that is dependent on crystallinity. As an example, the PCM component 20 can be formed from a chalcogenide material, such as germanium telluride (GeTe), germanium antimony telluride (GeSbTe), germanium selenium telluride (GeSeTe), or any of a variety of similar materials. A first conductive line 24 extends from a first end of the PCM component 20 and a second conductive line 25 extends from a second end of the PCM component 20 to form an input and an output terminal for the PCM switch 10. The first and second conductive lines 24 and 25 form transmission lines to and from the PCM component 20, and the first and second control lines 22 and 23 form control lines to and from the resistive heating material 16. The PCM component 20 has been annealed to place the PCM component 20 in a crystallized state to mitigate deleterious effects on the PCM component 20 caused by various processing steps as will be subsequently discussed.

The first and second control lines 22-23 and the first and second conductive lines 24-25 can be formed from one or more metal layers. For example, the control lines 24-25 and conductive lines 24-25 can be formed from an ohmic contact that is in contact with the PCM component 20 and/or resistive heating material 16, a diffusion barrier and a contact material layer that is in contact with the barrier layer and be employed to provide conductive lines to other devices.

In the example of FIGS. 2 and 3, a quench layer 26 overlies a portion of the control lines 22-23, the conductive lines 24-25, the PCM component 20 and portions of the resistive heating material 16. The quench layer 26 can be formed from a variety of thermally conductive materials, such as AlN, Si, SiC, or diamond to provide rapid cooling of the PCM component 20 to facilitate the PCM component 20 changing state between the blocking state and the conducting state via the control signal CTRL being provided through the resistive heating material 16. As an example, the quench layer 26 can be formed as a top, and thus final layer, with respect to the wafer during fabrication of the PCM switch structure 10. As a result, the quench layer 26 can be provided without any finishing steps (e.g., polishing, etching, etc.), thus providing for a more cost-effective and efficient fabrication process with respect to adding the quench layer 26 to the PCM switch structure 10.

Figure 4:
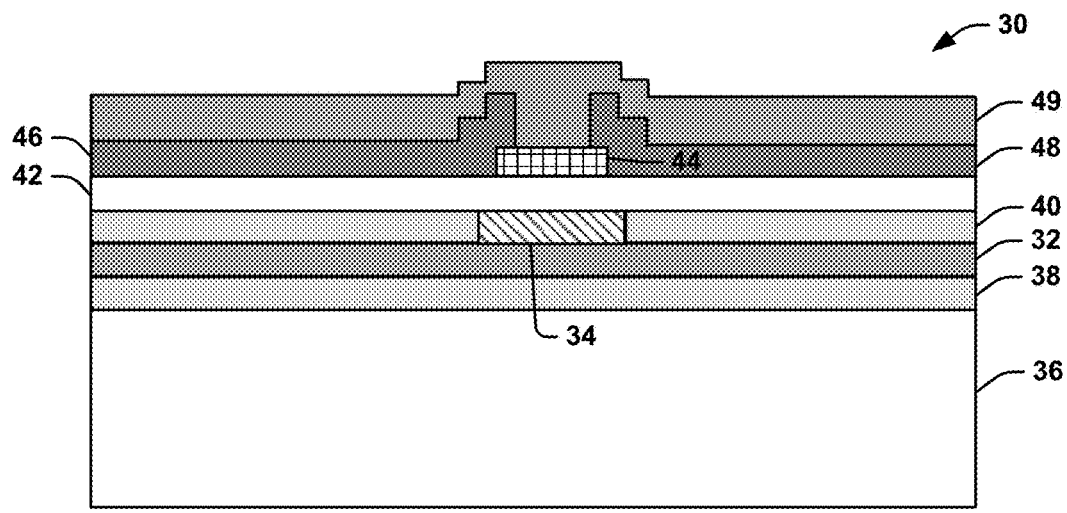
FIG. 4 illustrates another example of a schematic cross-sectional illustration of an example of a PCM switch structure.

FIG. 4 illustrates another example of a schematic cross-sectional illustration of a PCM switch structure 30. The PCM switch structure 30 can be arranged substantially similar to the PCM switch structure 10 demonstrated in the examples of FIGS. 2 and 3. However, in the example of FIG. 4, the PCM switch structure 30 includes a quench layer 32 that is arranged beneath a resistive heating material 34.

In the example of FIG. 4, the PCM switch structure 30 includes a first insulating layer 38 overlying a substrate 36, with the quench layer 32 overlying the first insulating layer 38. The first insulating layer 38 and the quench layer 32 electrically isolate the resistive heating element 34 from the substrate 36, and the quench layer 32 can provide heat dissipation of the heat generated by resistive heating element 34 to the substrate 36 via the first insulating layer 38, by acting as a heat spreader. The resistive heating element 34 can correspond to at least a portion of the actuation portion 6 of the phase-change material switch 2 in the example of FIG. 3. The resistive heating element 34 and a second insulating layer 40 overlay the first insulating layer 38, such that the second insulating layer 40 is in contact with at least one peripheral surface of the resistive heating element 34 over the quench layer 32. The insulating layer 40 can be one of a variety of electrically insulating materials such as Silicon Nitride (SiN), Silicon Dioxide (SiO2) or Aluminum Nitride (AlN). In addition, a barrier layer 42 overlies the resistive heating element 34. A PCM component 44, the input 46, and the output 48 overlay the barrier layer 42 and is positioned above the resistive heating element 34, such that heat from the resistive heating element 34 can pass through the barrier layer 42 to the PCM component 44 to provide either a conductive state or a blocking state with respect to signal transfer from the input 46 to the output 48.

Based on the location of the quench layer 32 in the PCM switch structure 30, the quench layer 32 can provide substantially improved quench capability with respect to the PCM component 44 and the resistive heating element 34. For example, because the quench layer 32 has higher thermal conductivity than the underlying layer 38, it can absorb more heat from the overlying structures in a shorter period of time, allowing for a faster quench (i.e., shorter quench time). It is to be understood that, during fabrication of the PCM switch structure 30, the quench layer 32 can be polished after deposition of the materials forming the quench layer 32 to provide a smooth surface on which the remaining layers (e.g., the resistive heating element 34 and the second insulating layer 40) are disposed. Thus, the step of polishing of the quench layer 32 can provide for a more stable PCM switch structure 30 subsequent to fabrication.

In the example of FIG. 4, the PCM switch structure 30 also includes a top layer 49. As an example, the top layer 49 can be configured as a passivation layer to protect the active elements from the environment. The top layer 49 that is provided as a passivation layer can be formed from SiN, $SiO_2$, $Al_2O_3$ or other electrically insulating materials. As another example, the top layer 49 can be configured as a second quench layer, similar to as described previously in the example of FIGS. 2 and 3. Thus, the top layer 49 that is provided as a second quench layer can cooperate with the quench layer 32 to provide improved quench of the PCM component 44. Thus, the combination of the quench layer 32 and the top layer 49 provided as a second quench layer can provide substantially greater quench capability than either the quench layer 26 in the example of FIGS. 2 and 3 or the quench layer 32 individually.

Figure 5:
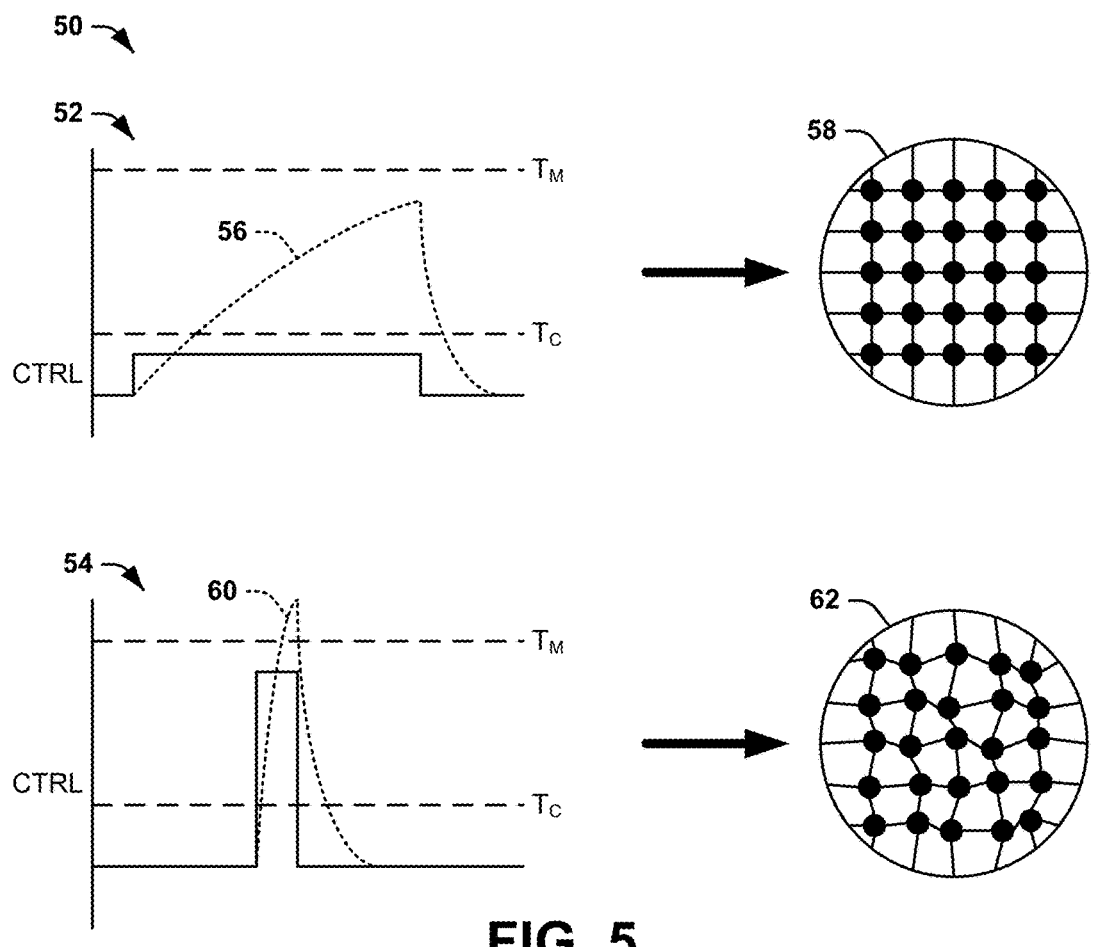
FIG. 5 illustrates an example of an example diagram of states of the PCM component of FIG. 1.

FIG. 5 illustrates an example diagram 50 of states of the PCM component 32 of FIG. 3. The diagram 50 includes a first state diagram 52 that demonstrates the control signal CTRL in a first state and a second state diagram 54 that demonstrates the control signal CTRL in a second state. In each of the first and second states, the control signal CTRL is demonstrated as a pulsed signal (e.g., current pulse) having separate pulse characteristics (e.g., amplitude and duration) relative to each other. In the example of FIG. 5, the first state of the control signal CTRL is demonstrated in the first state diagram 52 as having pulse characteristics of a substantially lower amplitude and a substantially longer pulse width relative to the control signal CTRL in the second state diagram 54, which has a substantially high amplitude and a substantially shorter pulse width. The pulse characteristics of the control signal CTRL in each of the first state diagram 52 and the second state diagram 54 can be selected to provide a desired heat profile sufficient to achieve one of crystallization and melting of the PCM, as described herein, while maintaining sufficiently rapid switching characteristics of the switch.

In response to the application of the control signal CTRL to the resistive heating element 40 in the first state, as demonstrated in the first state diagram 52, the resistive heating element 40 generates a first heat profile 56 that corresponds to a heat flux that is conducted to the PCM component 44 to induce a temperature T relative to a crystallization temperature $T_C$ and a melting temperature $T_M$. Thus, the first heat profile 56 provides that the heat conducted to the PCM component 32 results in a temperature T which is greater in amplitude than the crystallization temperature $T_C$, but less than the melting temperature $T_M$, and which remains greater than the crystallization temperature $T_C$ for a time sufficient to crystallize the PCM component 44. In the example of FIG. 5, the crystallization of the PCM component 44 is demonstrated at 58, which demonstrates the atoms of the PCM component 32 arranged in a substantially crystalline (i.e., crystal lattice) structure. Therefore, the PCM component 32 can be substantially conductive of electrical signals, such as the input signal IN shown in FIG. 1.

In response to the application of the control signal CTRL to the resistive heating element 40 in the second state, as demonstrated in the second state diagram 54, the resistive heating element 40 generates a second heat profile 60 that corresponds to a heat flux that is conducted to the PCM component 32 in the switch 30 resulting in a temperature relative to the crystallization temperature $T_C$ and the melting temperature $T_M$. Thus, the second heat profile 60 provides that the heat conducted to the PCM component 44 results in a temperature greater in amplitude than the melting temperature $T_M$, and leads to the transition of the PCM component 32 from solid to liquid state. Allowing the temperature to decay substantially rapidly after the falling-edge of the pulse of the control signal CTRL, such as based on the inclusion of a quench layer (e.g., the quench layer 26 and/or the quench layer 32), results in solidification of PCM component 44 in the amorphous state.

In the example of FIG. 5, the melting and rapid solidification of the PCM component 32 is demonstrated at 62, which demonstrates the atoms of the PCM component 32 arranged in an amorphous structure. Therefore, the PCM component 32 can be substantially blocking of electrical signals, such as the input signal IN, in the example of FIG. 1.

It is to be understood that the characteristics of the thermally conductive electrical insulator, such as with respect to the type of the material and the thickness therein, can be selected to ensure a substantially rapid dissipation of the heat of the PCM component 44 to substantially mitigate the recrystallization of the PCM component 44 subsequent to melting during the amorphization process.

As demonstrated in the example of FIG. 5, the control signal CTRL is provided as a pulsed signal that implements a single pulse to switch PCM component 44 between the conducting state and the blocking state. Subsequent to the application of the control signal CTRL to the resistive heating element 34, the PCM component 40 remains in one of the crystalline state and the amorphous state, such that the PCM switch 30 remains in the respective one of the conducting portion and the blocking portion after application of the control signal CTRL. As a result, the PCM switch 30 is held in one of the conducting state and the blocking state without application of any signal, and can thus operate with significantly less power than typical switches (e.g., transistor and diode switches). The PCM switch 30 can also exhibit sufficiently low losses with respect to the input signal IN (e.g., less than 0.3 dB for RF signals of frequencies up to 40 GHz). Furthermore, the PCM switch 30 can exhibit significant isolation of the input signal IN (e.g., greater than 10 dB for RF signals of frequencies up to 40 GHz).

Figure 6:
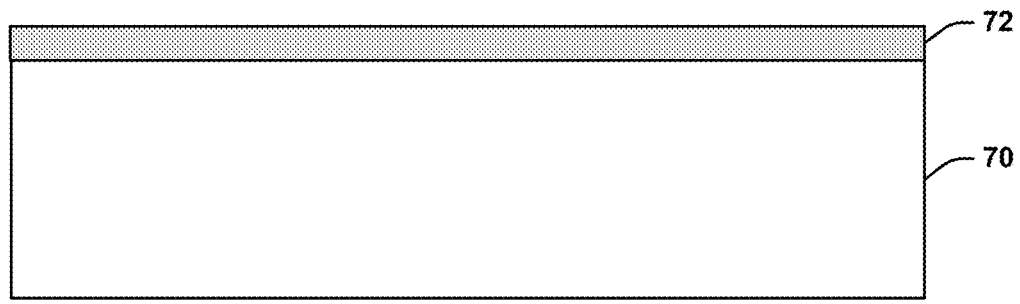
FIG. 6 illustrates an example of a schematic cross-sectional illustration of an example PCM switch structure in its early stages of fabrication.

Turning now to FIGS. 6-24, process blocks in connection with fabrication of the PCM switch 10 in the examples of FIGS. 2 and 3 are described. FIG. 6 illustrates a cross-sectional view of PCM switch structure in its early stages of fabrication. The PCM switch structure includes a substrate 70 that provides mechanical support for materials forming a PCM switch. The substrate 70 can be formed of mechanically supportive, insulating, semiconducting and/or conducting materials, such as, but not limited to, Silicon Carbide (SiC), Silicon (Si), and/or Gallium Arsenide (GaAs), ($Al_2O_3$), Alumina, Quartz ($SiO_2$), Germanium (Ge), Gallium Nitride (GaN), Indium Phosphide (InP), Silicon-on-Insulator (SOI), Silicon-on-Sapphire (SOS), and/or Silicon Germanium (SiGe). The PCM switch could also be added directly to another device wafer (e.g. CMOS, SiGe BiCMOS, RF-CMOS) with preexisting circuits such as MMICs, ASICs or RFICs.

An insulating layer 72 is deposited over the substrate. Any suitable technique for depositing the insulating layer 72 can be employed such as deposited via Plasma Enhanced Chemical Vapor Deposition (PECVD) and/or growing the insulating layer by oxidizing the substrate 70 at high temperature. The insulating layer 72 can have a thickness in the range of about 10 nm to about 1 um to electrically isolate a subsequently formed resistive heating element from the substrate 70. The insulating layer 72 can be formed of SiO$_2$, Al$_2$O$_3$, AlN, SiN or a variety of other electrically insulating materials.

Figure 7:
FIG. 7 illustrates an example of a schematic cross-sectional illustration of the structure of FIG. 6 undergoing a resistive heater material deposition.
Figure 7:
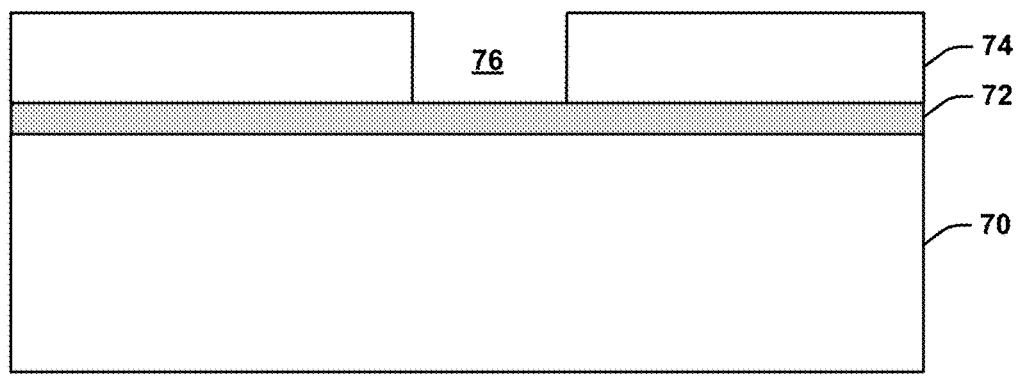
Figure 8:
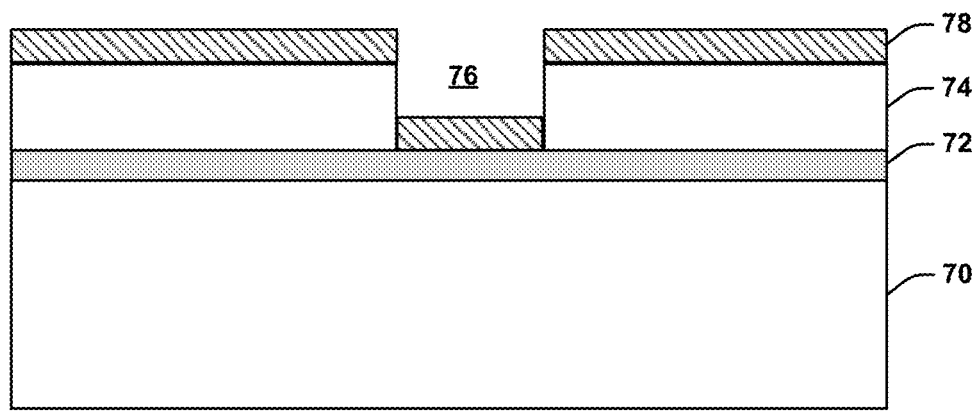
FIG. 8 illustrates an example of a schematic cross-sectional illustration of the structure of FIG. 7 after undergoing the resistive heater material deposition.

Next, as represented in FIG. 7, a photoresist material layer 74 is applied to cover the structure and is then patterned and developed to expose open region 76 in the photoresist material layer 74 in accordance with a desired pattern. The photoresist material layer 74 may be formed over the insulating layer 72 via spin-coating or spin casting deposition techniques, selectively irradiated and developed to form the opening 76.

Figure 9:
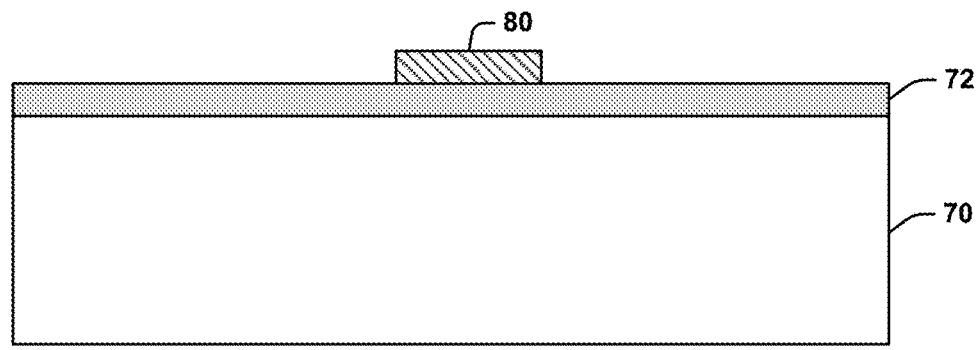
FIG. 9 illustrates an example of a schematic cross-sectional illustration of the structure of FIG. 8 after undergoing a photoresist material lift off process.

A resistive heater material deposition process 150 is performed on the structure of FIG. 7 to form a resistive heating element 80 (FIG. 9). The resistive heater material deposition process 150 also results in a resistive heater material layer 78 overlying the photoresist material layer 74, as illustrated in the resultant structure of FIG. 8. The resistive heater material deposition process 150 can be performed by sputtering resistive heater materials into the opening of the patterned photoresist material layer.

The resistive heater materials can include, for example, a metal or metal alloy material that exhibits resistivity and a substantially high thermal conductivity. For example, the resistive heater materials can be nickel chromium silicon (NiCrSi), Nickel Chromium (NiCr), Tungsten (W), Titanium-Tungsten (TiW), Platinum (Pt), Tantalum (Ta), Molybdenum (Mo), Niobium (Nb), or Iridium (Ir), or any of a variety of or a combination of similar metal or metal alloys that have the above properties and have a melting temperature that is higher than the melting temperature of the PCM of the PCM switch.

Figure 10:
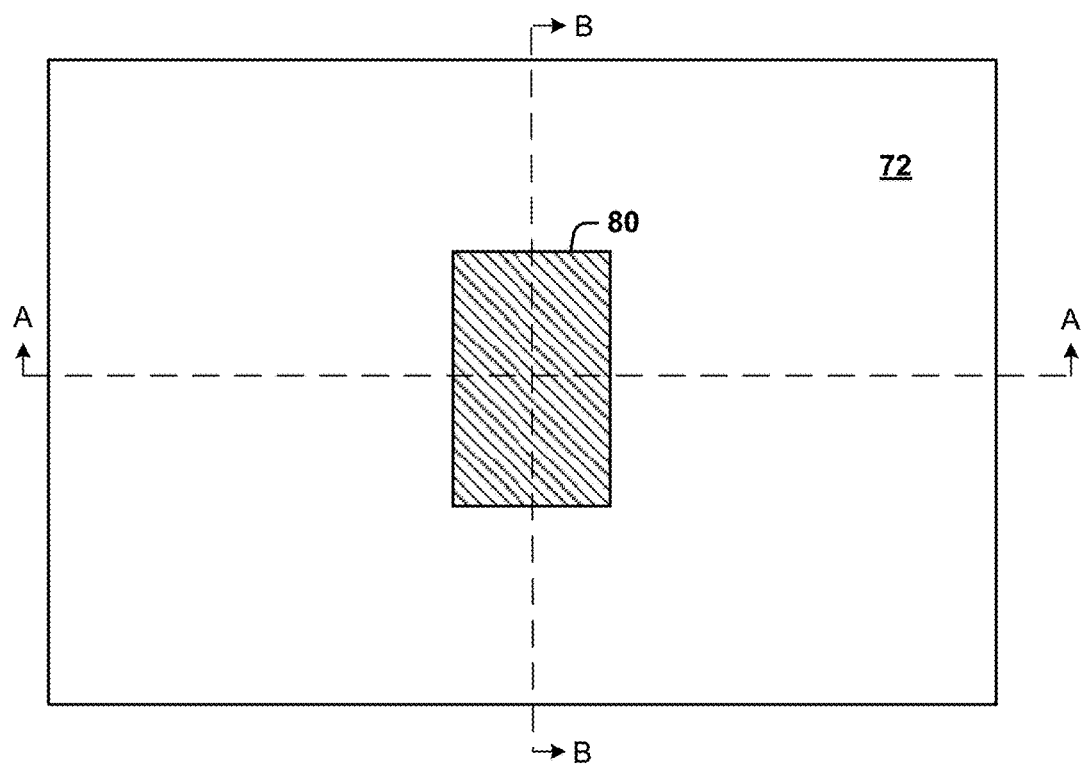
FIG. 10 illustrates an example of a plan view of the resultant structure of FIG. 9.

The photoresist material layer 74 is then lifted off employing a chemical solvent lift off material to remove the photoresist material layer 74 and the excess resistive heater material layer 78 overlying the photoresist material layer 74 to leave the resistive heating element 80, as illustrated in the resultant cross-sectional structure of FIG. 9 along lines A-A of FIG. 10. FIG. 10 illustrates a plan view of the resultant structure show in FIG. 9. Other standard known photolithography and deposition techniques could be employed to form the resistive heating element such as sputtering of a blanket coat of the resistive heater material onto layer 72 in FIG. 6 followed by selective etching of the film to form the heater geometry of FIG. 10.

Figure 11:
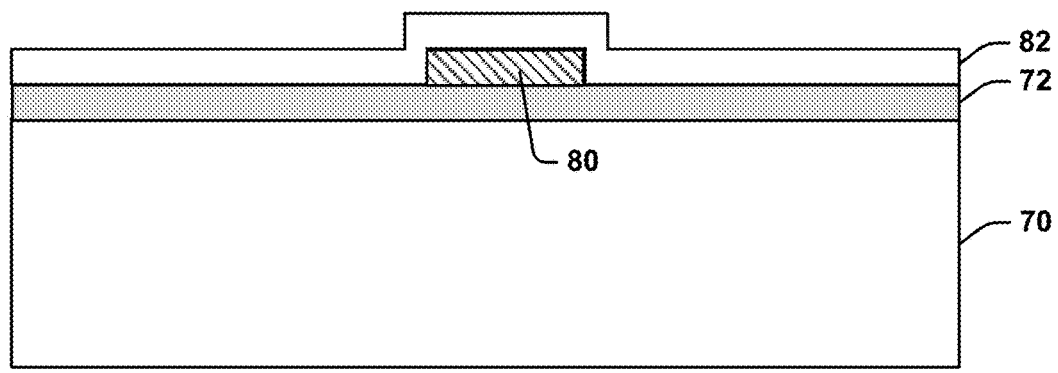
FIG. 11 illustrates an example of a schematic cross-sectional illustration of the structure of FIGS. 9 and 10 after undergoing a barrier layer deposition.
Figure 12:
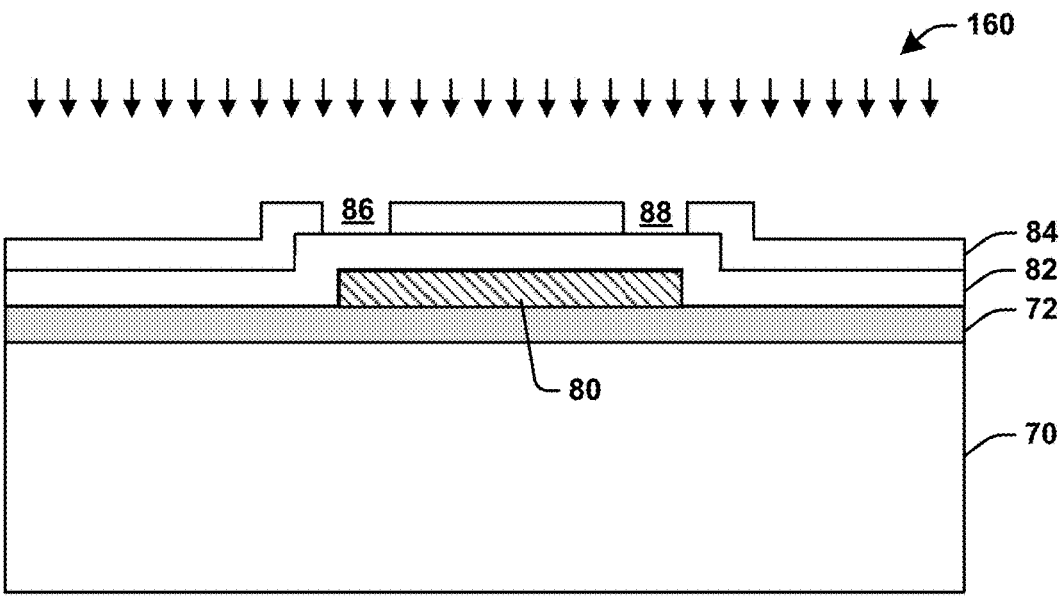
FIG. 12 illustrates an example of a schematic cross-sectional illustration of the structure of FIG. 11 along the lines B-B undergoing an etch to form openings in the barrier layer.
Figure 13:
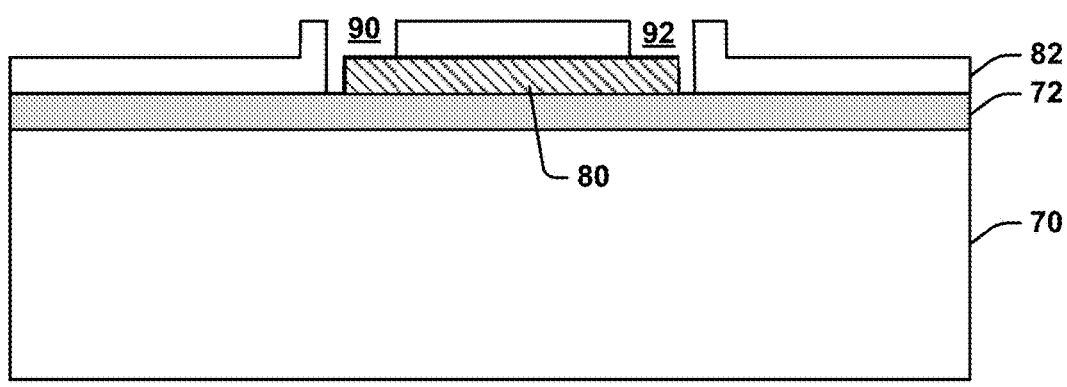
FIG. 13 illustrates an example of a schematic cross-sectional illustration of the structure of FIG. 12 after stripping of the photoresist material layer.

Next, a barrier layer 82 is deposited over the structure illustrated in FIGS. 9 and 10 to provide the resultant structure shown in FIG. 11. Any suitable technique for forming the barrier layer 82 may be employed such as Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDP-CVD) techniques or spin on techniques to a thickness in the range of about 1 nm to about 500 nm. The barrier layer 82 is an electrical insulator that is thermally conductive, such that the barrier layer 82 electrically insulates the heater 80 overlaying layers, but allows heat to pass through the barrier layer 82 to the overlying layers. The barrier layer 82 can be formed from one of or a combination of SiN, AlN, SiO$_2$, SiC, or other barrier materials having the properties discussed above FIG. 12 is a cross-sectional view of the structure of FIG. 11 along the lines B-B during the formation of openings in the barrier layer 82 to provide access for control lines to ends of the resistive heating element 80. As shown in FIG. 12, a photoresist material layer 84 is applied to cover the structure and is then patterned and developed to expose open regions 86 and 88 in the photoresist material layer 84 in accordance with a desired pattern. The photoresist material layer 84 may be formed over the barrier layer 82 via spin-coating or spin casting deposition techniques, selectively irradiated and developed to form the openings 86 and 88.

Figure 14:
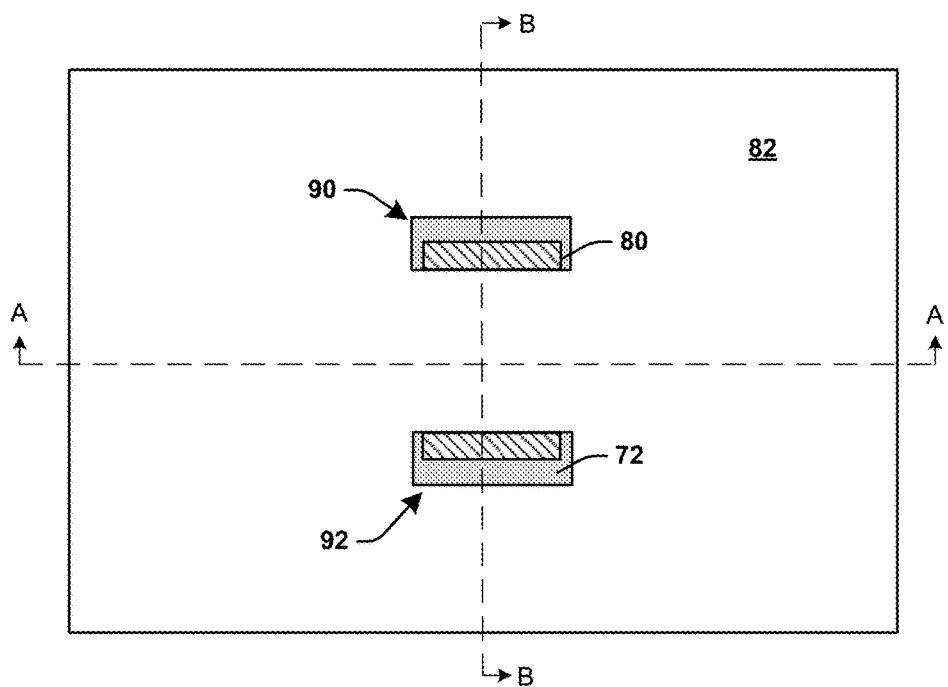
FIG. 14 illustrates an example of a plan view of the resultant structure of FIG. 13.

FIG. 12 also illustrates performing of an etch 160 (e.g., anisotropic reactive ion etching (RIE)) on the barrier layer 82 to form extended openings 90 and 92 (FIG. 13) in the barrier layer 82 based on the pattern in the photoresist material layer 84. The etch step 160 can be a dry etch that employs an etchant which selectively etches the barrier layer 82 at a faster rate than the underlying layers and the overlying photoresist material layer 84. For example, the barrier layer 82 may be anisotropically etched with a plasma gas, in a commercially available etcher, such as a reactive ion etcher (RIE) to replicate the mask pattern of the patterned photoresist material layer 84 to thereby create the extended openings 90 and 92. The photoresist material layer 84 is then stripped to provide the resultant structure of FIG. 13 with extended openings 90 and 92 to provide contact access to ends of the resistive heater device 80. FIG. 14 illustrates the plan view of the resultant structure of FIG. 13.

Figure 15:
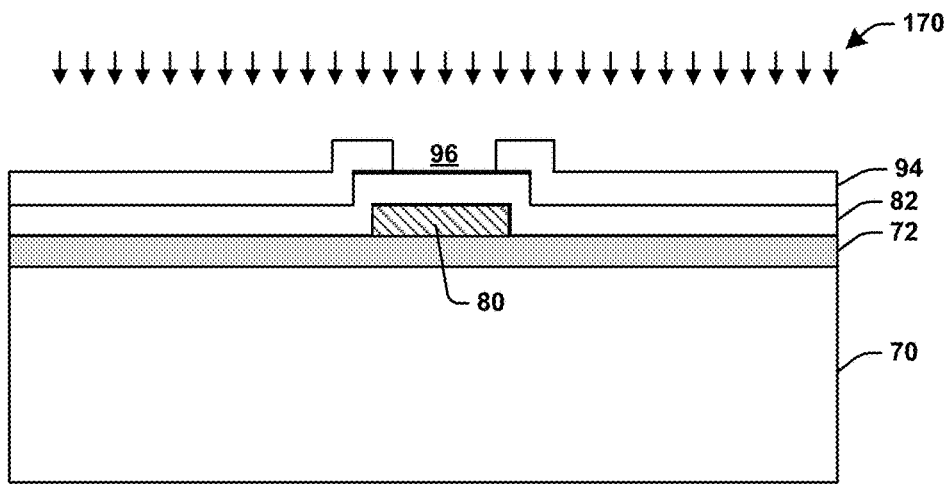
FIG. 15 illustrates an example of a schematic cross-sectional illustration of the structure of FIGS. 13 and 14 undergoing a PCM deposition.

Next, referring to FIG. 15 corresponding to a cross-sectional view along lines A-A in FIG. 14, a photoresist material layer 94 is applied to cover the structure and is then patterned and developed to expose open region 96 in the photoresist material layer 94 in accordance with a desired pattern. The photoresist material layer 94 may be formed over the barrier layer 82 via spin-coating or spin casting deposition techniques, selectively irradiated and developed to form the opening 96.

Figure 17:
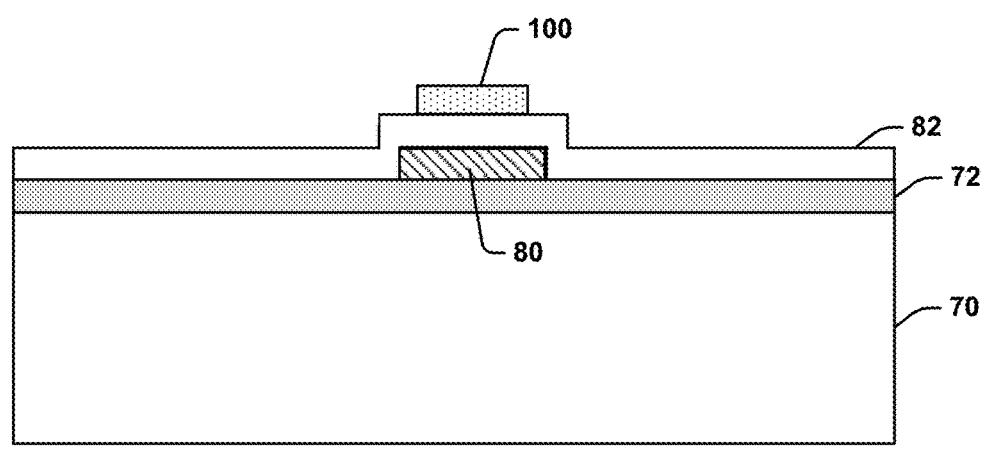
FIG. 17 illustrates an example of a schematic cross-sectional illustration of the structure of FIG. 16 after undergoing a photoresist material lift off process.

A PCM deposition process 170 is performed on the structure of FIG. 15 to deposit PCM in the amorphous state to form a PCM component 100 (FIG. 17). Alternatively, the PCM deposition process 170 can be a heated deposition such that the PCM is deposited as a polycrystalline or crystalline film. As an example, the thickness of the deposited PCM can be around 100 nanometers. The PCM component 100 can be formed from a variety of PCMs that exhibit variable electrical resistivity that is dependent on crystallinity. As an example, the PCM component 100 can be formed from a chalcogenide material, such as germanium telluride (GeTe), germanium antimony telluride (GeSbTe), germanium selenium telluride (GeSeTe), or any of a variety of similar materials. The PCM can be deposited employing a variety of deposition techniques, such as Physical Vapor Deposition (PVD) (e.g., metal evaporation, sputtering), Chemical Vapor Deposition (CVD), and/or Atomic Layer Deposition (ALD).

Figure 16:
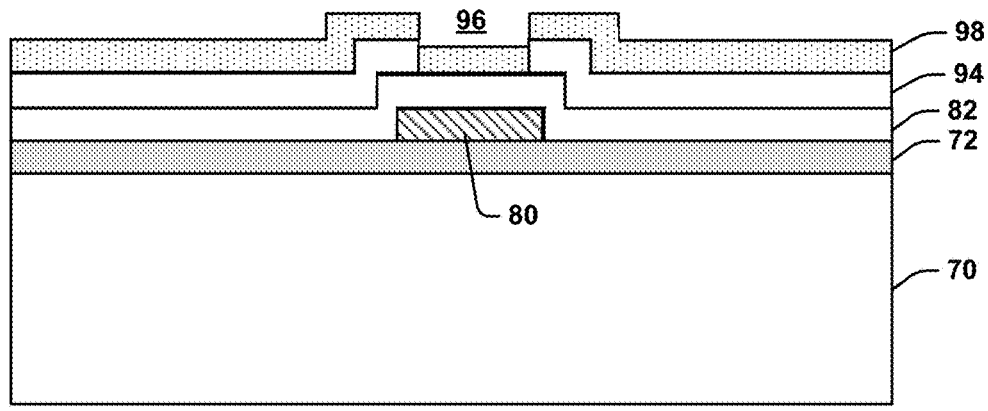
FIG. 16 illustrates an example of a schematic cross-sectional illustration of the structure of FIG. 15 after undergoing the PCM deposition.

The PCM deposition process 170 results in a PCM layer 98 overlying the photoresist material layer 94, as illustrated in the resultant structure of FIG. 16. The photoresist material layer 94, and PCM layer 98 can be removed by applying a chemical solvent lift-off material to provide the resultant structure of FIG. 17.

Figure 18:
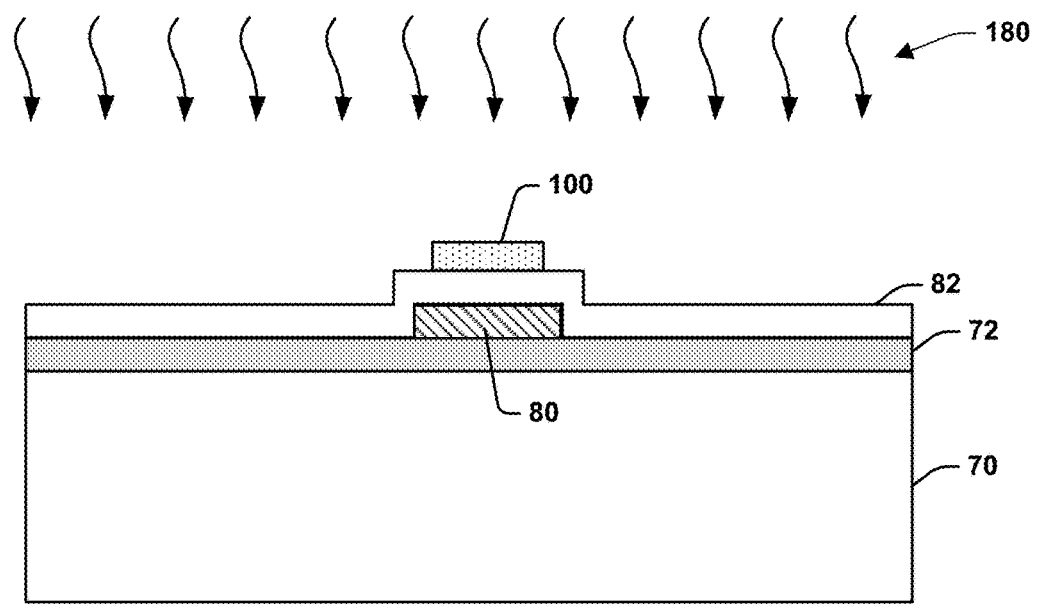
FIG. 18 illustrates an example of a schematic cross-sectional illustration of the structure of FIG. 17 undergoing an anneal process.
Figure 19:
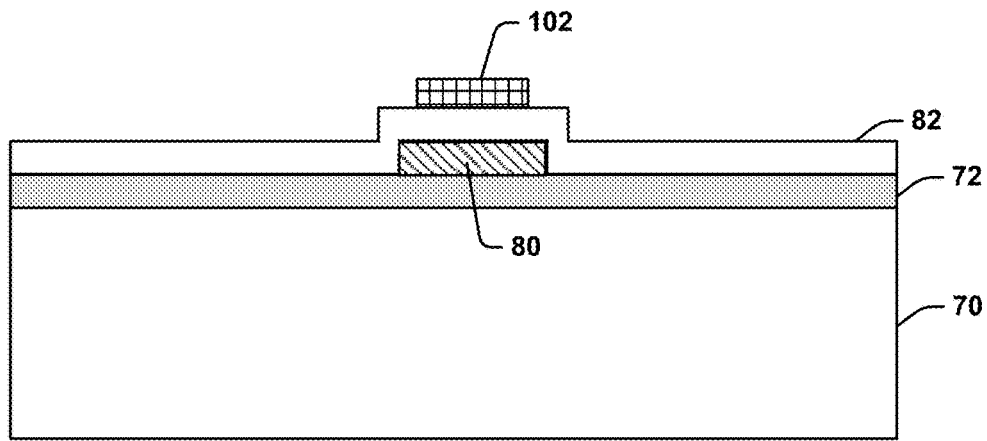
FIG. 19 illustrates an example of a schematic cross-sectional illustration of the structure of FIG. 18 after undergoing the anneal process.
Figure 20:
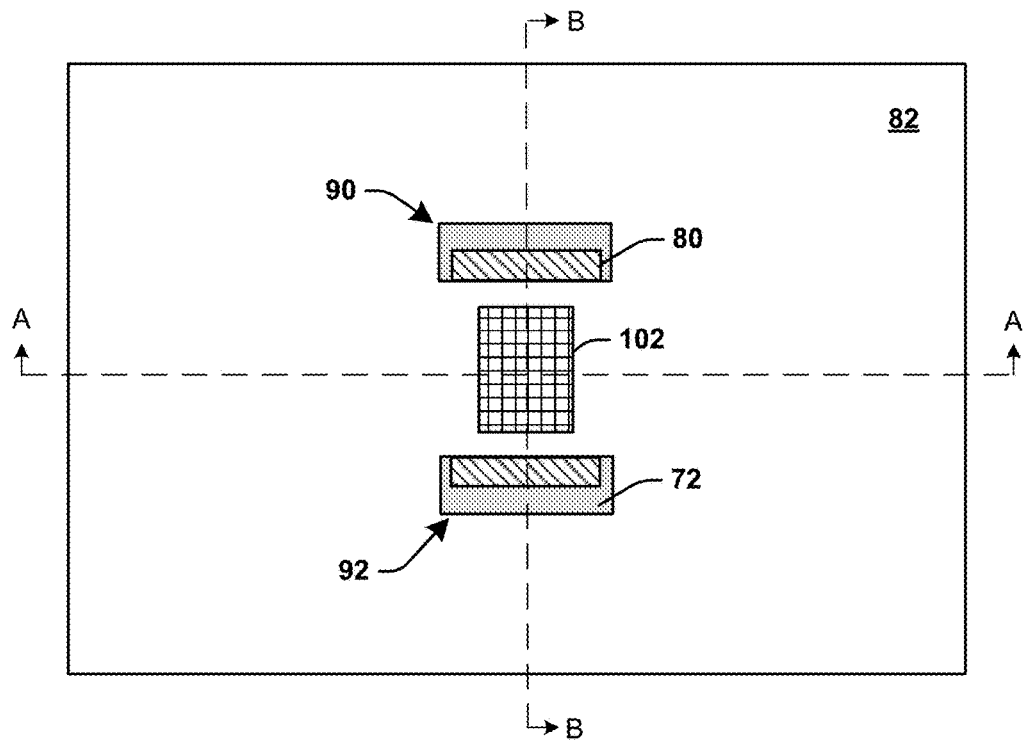
FIG. 20 illustrates an example of a plan view of the resultant structure of FIG. 19.

In order to lower the crystalline on-state resistivity and improve the PCM resistance to further processing chemicals, an anneal process 180 may be performed as shown in FIG. 18 to more fully crystallize the PCM component 102. The resultant structure is illustrated in FIG. 19, such that a modified PCM component 102 results that has changed from the amorphous state to the crystalline state. It has been determined that the PCM component 102 in the crystalline state is more immune to subsequent processing than the PCM component 100 in the amorphous state. A plan view of the resultant structure is shown in FIG. 20. The anneal process 180 can be skipped if the PCM is deposited in a polycrystalline or crystalline state.

Next, referring to the cross-sectional view along lines A-A in FIG. 20, a photoresist material layer 104 is applied to cover the structure and is then patterned and developed to expose trenches in the photoresist material layer 104 in accordance with a desired pattern. The trenches are formed for depositing conductive material for forming conductive lines 106 and 108 to the PCM strip 102 and control lines 110 and 112 to the resistive heating element 80 (see FIG. 23). The conductive line trenches and one of the control line trenches is not shown in FIG. 22, since it has been cut away in illustration of the cross-sectional view. The dashed lines illustrate one trench 105 for forming one of the control lines to the resistive heating device 80 resides behind the PCM component 102. The photoresist material layer 104 may be formed over the barrier layer 82 via spin-coating or spin casting deposition techniques, selectively irradiated and developed to form the trenches 105.

Figure 21:
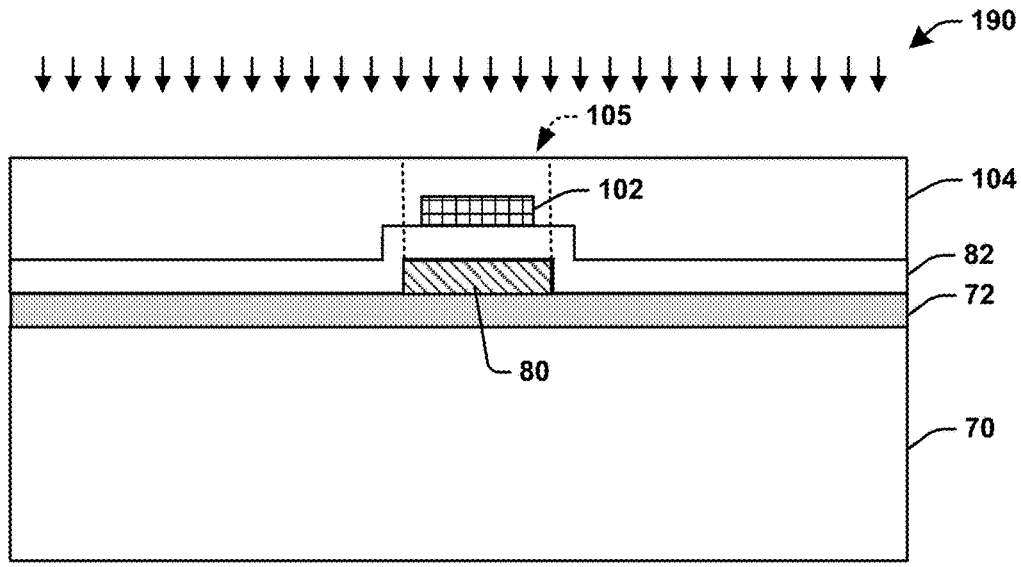
FIG. 21 illustrates an example of a schematic cross-sectional illustration of the structure of FIGS. 19 and 20 after undergoing conductive material deposition.
Figure 22:
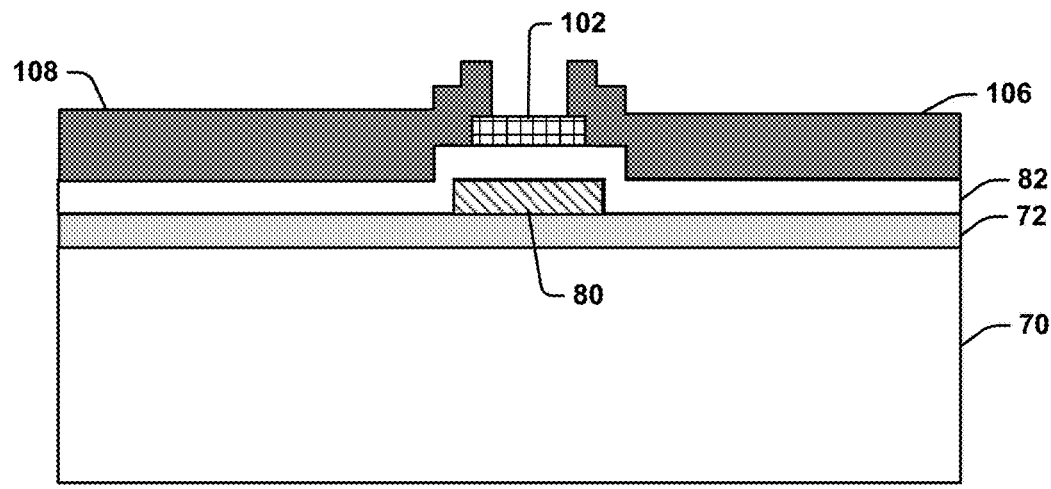
FIG. 22 illustrates an example of a schematic cross-sectional illustration of the structure of FIG. 21 after undergoing a photoresist material lift off process.
Figure 23:
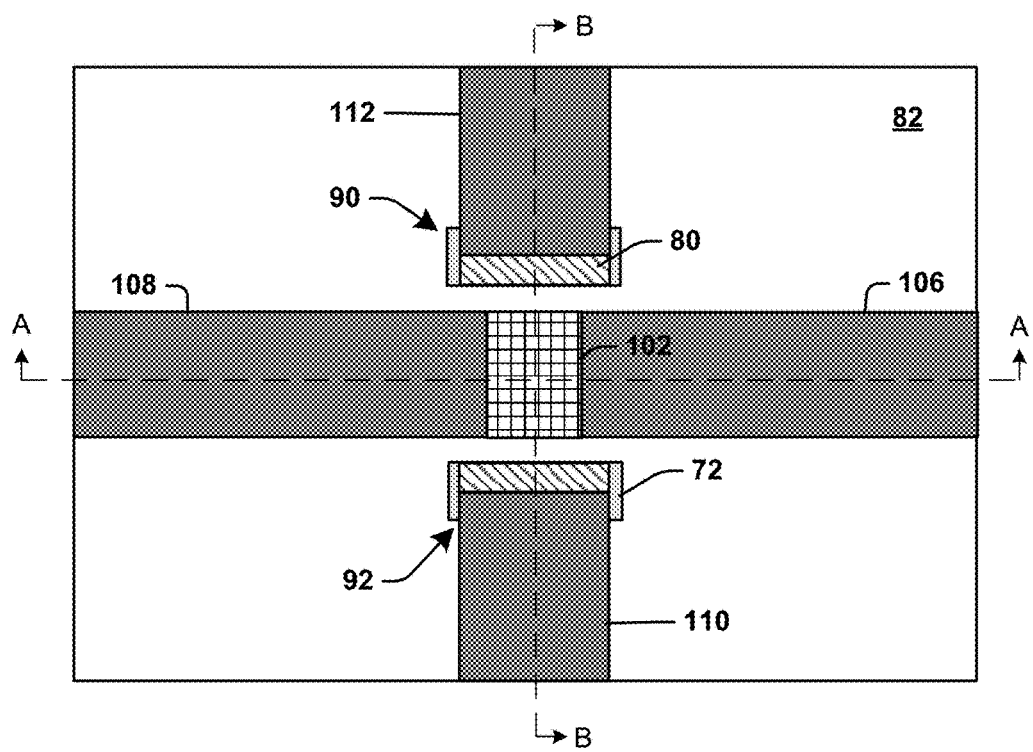
FIG. 23 is a plan view of the resultant structure of FIG. 22.

A contact material deposition process 190 is performed on the structure of FIG. 21 to form conductive lines 106 and 108 to the PCM component 102 and control lines 110 and 112 to the resistive heating element 80. After the photoresist material is stripped, the resultant structure is illustrated in FIG. 22. The contact material deposition process 190 could be a contact material evaporation process, such that one or more conductive materials are deposited to form conductive lines 106 and 108 and control lines 110 and 112. A pre-cleaning procedure can be performed on ends of the resistive heating element 80 and the PCM component 102 that relies on the hardened PCM component 102 produced by the anneal process 180 shown in FIG. 18. In one example, an ohmic contact metal is deposited on the ends of the PCM component 102 and the ends of the resistive heating element 80. Conductive lines having a thickness of about 10 nm to about 5 um are deposited in contact with the ohmic contact metal to form conductive lines 106 and 108 and control lines 110 and 112. Examples of ohmic contact metals include but are not limited to Tungsten (W), Aluminum (Al), Chromium (Cr), Titanium (Ti), Nickel (Ni), Tin (Sn), Molybdenum (Mo), and Platinum (Pt). Examples of materials used for conductive lines include but are not limited to Gold (Au), Copper (Cu) and Aluminum (Al).

Figure 24:
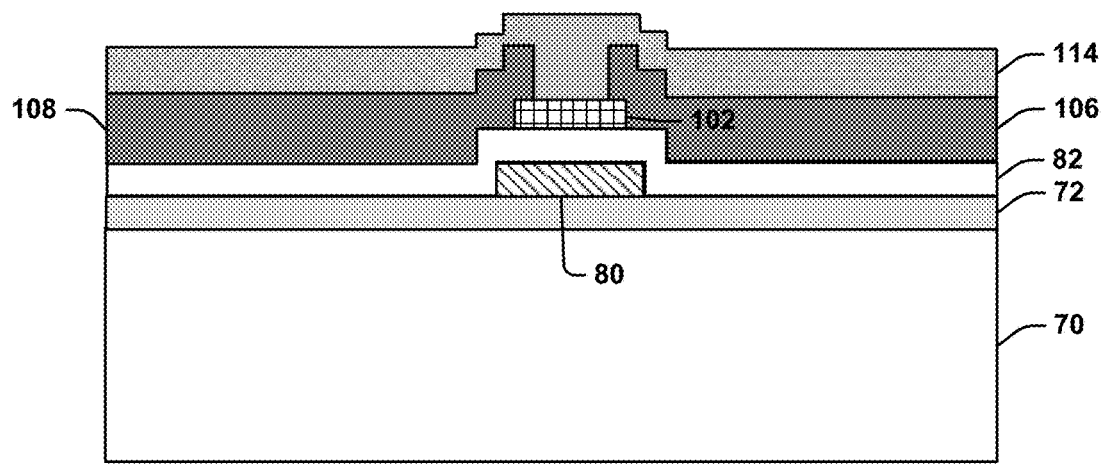
FIG. 24 illustrates an example of a schematic cross-sectional illustration of the structure of FIG. 23 after undergoing a quench layer deposition.

FIG. 24 demonstrates that a quench layer 114 is then deposited over the structure shown in FIG. 22. The quench layer 114 can be formed from AlN, SiC, Si, diamond, or any of a variety of other materials having a substantially high thermal conductivity. The quench layer 114 can be deposited employing sputtering, CVD, ALD, or a variety of other techniques that are compatible with temperature restrictions of the other materials of the structure. As an example, the quench layer 114 can be deposited with a nominal thickness of approximately 1 µm, but can be thinner or thicker depending on the thermal conductivity and thermal mass of the material that is selected for the quench layer 114. As an example, the quench layer 114 can be selected to have a high enough thermal mass to absorb substantially all the heat from the PCM component 102 after it is melted by application of an amorphizing pulse via the resistive heating element, and can have a high enough thermal conductivity to allow for rapid transfer of heat from the PCM component 102 to the quench layer 114. Accordingly, the example of FIG. 24 demonstrates a substantially complete PCM switch structure (e.g., the PCM switch structure 10).

It is to be appreciated that although the examples illustrated in FIGS. 6-24 demonstrate fabrication of a PCM switch structure that includes a quench layer formed at the top of the PCM switch structure, the PCM switch structure 30 in the example of FIG. 4 can be fabricated substantially similarly. For example, the structure demonstrated in FIG. 6 can have a quench layer (e.g., the resultant quench layer 32) formed over the insulating layer 72 prior to the application of the photoresist material layer 74 in the example of FIG. 7. As an example, the quench layer that is formed over the insulating layer 72 can have a thickness of between approximately 1-2 µm to provide sufficient quench capability. The quench layer can subsequently be polished after being deposited onto the insulating layer 72. Additionally, an insulating material layer (e.g., the resultant second insulating layer 40) can be formed on the structure demonstrated in the example of FIGS. 9 and 10, and can optionally have a portion etched or polished away from above the resistive heating element 80 prior to application of the barrier layer 82 in the example of FIG. 11. The rest of the fabrication steps demonstrated in subsequent examples of FIGS. 12-24 can be substantially the same, with the top layer in the example of FIG. 24 being either the quench layer 114, such that the resultant PCM switch structure includes two quench layers, or a passivation layer.

In addition, it is to be understood that the resultant PCM structure can be configured in a variety of other ways than that demonstrated in the examples of FIGS. 2-4 and 6-24. For example, a single resistive heating element can disposed below, offset and spaced apart from the PCM component, or a single resistive heating element can be disposed above and spaced apart from the PCM component or disposed above, offset and spaced apart from the PCM component. Additionally, a first resistive heating element can be disposed above and spaced apart from the PCM component and a second resistive heating element can be disposed below and spaced apart from the PCM component, such that the first and second resistive heating elements can be conductively coupled together. Furthermore, a resistive heating element can be formed of three (e.g., u-shaped) or four sides (e.g., box shaped) to partially or substantially surround the PCM component. In these examples, the PCM switch structure can include one or more quench layers proximal to or in contact with at least one of the PCM component and the resistive heating element to provide sufficient quench capability, and thus an operable reconfigurable switch structure with sufficiently fast switching time.

What has been described above includes exemplary implementations of the present disclosure. It is, of course, not possible to describe every conceivable combination of components or methodologies for purposes of describing the present disclosure, but one of ordinary skill in the art will recognize that many further combinations and permutations of the present disclosure are possible. Accordingly, the present disclosure is intended to embrace all such alterations, modifications, and variations.

What is claimed is:

1. A method for making a switch, the method comprising:
   forming an insulating layer over a substrate;
   forming a quench layer over the insulating layer, the quench layer being adapted to dissipate heat associated with a resistive heating material and a phase-change material (PCM) component, the quench layer being formed as at least one of Silicon (Si), Silicon Carbide (SiC), or diamond;
   forming the resistive heating material over the quench layer;
   depositing a thermally conductive electrically insulating barrier layer over the resistive heating material;

forming the phase-change material (PCM) component over the barrier layer spaced apart and proximal to the resistive heating material and the quench layer; and forming conductive lines from ends of the PCM component and control lines from ends of the resistive heating material.

2. The method of claim 1, wherein forming the quench layer comprises forming the quench layer over the PCM component and the conductive lines.

3. The method of claim 1, further comprising polishing the quench layer to provide a substantially planar surface of the quench layer on which the resistive heating material is formed.

4. The method of claim 1, wherein the insulating layer is a first insulating layer, the method further comprising forming a second insulating layer in contact with at least one peripheral surface of the resistive heating material over the quench layer, such that the second insulating layer and the resistive heating material overly the quench layer.

5. The method of claim 1, wherein forming the quench layer comprises:
   forming a first quench layer over the insulating layer;
   polishing the first quench layer to provide a substantially planar surface, wherein forming the resistive heating material comprises forming the resistive heating material over the substantially planar surface of the first quench layer; and
   forming a second quench layer over the PCM component and the conductive lines.

6. A method for making a switch, the method comprising:
   forming an insulating layer over a substrate;
   forming a first quench layer over the insulating layer, the first quench layer being formed as one of Silicon (Si), Silicon Carbide (SiC), or diamond;
   forming a resistive heating material over the first quench layer;
   depositing a thermally conductive electrically insulating barrier layer over the resistive heating material;
   forming a phase-change material (PCM) component over the barrier layer spaced apart and proximal to the resistive heating material;
   forming conductive lines from ends of the PCM component and control lines from ends of the resistive heating material; and
   forming a second quench layer over the resistive heating material and the PCM component, the second quench layer being adapted to dissipate heat associated with at least one of the resistive heating material and the PCM component, the second quench layer being formed as one of Silicon (Si), Silicon Carbide (SiC), or diamond.

7. The method of claim 6, further comprising polishing the first quench layer to provide a substantially planar surface of the first quench layer on which the resistive heating material is formed.

8. The method of claim 6, wherein the insulating layer is a first insulating layer, the method further comprising forming a second insulating layer in contact with at least one peripheral surface of the resistive heating material over the first quench layer, such that the second insulating layer and the resistive heating material overly the first quench layer.

* * * * *